(12) United States Patent
Orr

(10) Patent No.: US 10,581,391 B2
(45) Date of Patent: Mar. 3, 2020

(54) AMPLIFIERS

(71) Applicant: Cirrus Logic International Semiconductor Ltd., Edinburgh (GB)

(72) Inventor: Terence Orr, Edinburgh (GB)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 16/251,905

(22) Filed: Jan. 18, 2019

(65) Prior Publication Data

US 2019/0181811 A1 Jun. 13, 2019

Related U.S. Application Data

(63) Continuation of application No. 15/903,734, filed on Feb. 23, 2018, now Pat. No. 10,243,524.

(Continued)

(30) Foreign Application Priority Data

Mar. 17, 2017 (GB) .................................. 1704282.1

(51) Int. Cl.
*H03F 3/187* (2006.01)
*H03F 3/217* (2006.01)
(Continued)

(52) U.S. Cl.
CPC ............. *H03F 3/187* (2013.01); *G05F 1/575* (2013.01); *H02M 3/1582* (2013.01);
(Continued)

(58) Field of Classification Search
CPC .......... G05F 1/575; G05F 1/00; H02M 3/158; H02M 3/1582; H03F 1/02; H03F 1/0227;
(Continued)

(56) References Cited

U.S. PATENT DOCUMENTS

| 4,503,513 A | * | 3/1985 | Pogue, Jr. ............. H03J 1/0025 455/152.1 |
| 4,771,390 A | * | 9/1988 | Dolph ................. B60R 16/0373 704/258 |

(Continued)

FOREIGN PATENT DOCUMENTS

| EP | 2056451 A2 | 5/2009 |
| GB | 2475636 A | 5/2011 |

(Continued)

OTHER PUBLICATIONS

Combined Search and Examination Report under Sections 17 and 18(3), Application No. GB1704282.1, dated Sep. 19, 2017.

(Continued)

*Primary Examiner* — Gerald Gauthier
(74) *Attorney, Agent, or Firm* — Jackson Walker L.L.P.

(57) ABSTRACT

This application relates to amplifier circuits for amplifying an audio signal. An amplifier circuit (100) has a voltage regulator (201) for outputting a supply voltage to an amplifier (104). An output capacitor (103) coupled to an output node of the voltage regulator. The voltage regulator is operable in a voltage-control mode to maintain the output voltage ($V_S$) at a nominal output voltage and in current-control mode to limit the input current drawn to exceed a defined limit. A controller (301) is operable in a first mode to define the nominal output voltage so as not to exceed a first voltage magnitude and in a second mode to define the nominal output voltage to be equal to a second, higher, voltage magnitude. The controller (301) monitors the audio signal for a high-amplitude part of the audio signal, that could result in the voltage regulator operating in the current-control mode to apply current limiting and, on such detection swaps from the first to the second mode until such a high-amplitude part of the audio signal has been amplified. The second voltage magnitude is greater than required for (Continued)

US 10,581,391 B2
Page 2 voltage headroom for amplifying the high-amplitude part of the audio signal so as to allow for a voltage droop of the output voltage over a plurality of switching cycles of the voltage regulator when operating in the current-control mode.

21 Claims, 7 Drawing Sheets

Related U.S. Application Data

(60) Provisional application No. 62/464,695, filed on Feb. 28, 2017.

(51) Int. Cl.
| | |
|---|---|
| H02M 3/158 | (2006.01) |
| H04R 3/00 | (2006.01) |
| G05F 1/575 | (2006.01) |
| H03F 1/02 | (2006.01) |
| H04R 29/00 | (2006.01) |

(52) U.S. Cl.
CPC ............ *H03F 1/025* (2013.01); *H03F 1/0227* (2013.01); *H03F 3/217* (2013.01); *H04R 3/00* (2013.01); *H03F 2200/03* (2013.01); *H04R 29/001* (2013.01); *H04R 2430/01* (2013.01)

(58) Field of Classification Search
CPC .......... H03F 1/025; H03F 3/187; H03F 3/217; H03F 2200/03; H03G 3/00; H03G 3/22; H04R 3/00; H04R 2430/01; H04R 29/001
USPC ........ 318/723; 323/273, 280, 282, 284, 285, 323/288, 223, 225; 326/46; 327/156, 327/540; 330/10, 116, 127, 207 P, 297, 330/298, 136; 340/815.45; 363/16, 363/21.01, 78; 365/189.011; 368/10; 381/74, 120, 97, 111, 121; 455/232.1; 700/94; 704/274; 710/110; 713/340
See application file for complete search history.

(56) References Cited

U.S. PATENT DOCUMENTS

| | | | | |
|---|---|---|---|---|
| 4,825,385 A * | 4/1989 | Dolph | ................. | B60R 16/0373 340/539.1 |
| 5,382,915 A * | 1/1995 | Muri | ................. | H03F 3/2171 330/10 |
| 5,506,493 A * | 4/1996 | Stengel | ................. | H02M 3/158 323/223 |
| 5,535,444 A * | 7/1996 | Grandfield | ........... | H03G 3/3036 455/232.1 |
| 5,606,289 A * | 2/1997 | Williamson | ........... | H02M 7/537 330/297 |
| 5,657,004 A * | 8/1997 | Whittaker | ............... | G09F 27/00 340/525 |
| 5,834,977 A * | 11/1998 | Maehara | ............... | H03F 1/0238 330/297 |
| 5,881,021 A * | 3/1999 | Pirie | ..................... | B06B 1/0284 340/514 |
| 5,912,552 A * | 6/1999 | Tateishi | ............... | H02M 3/1588 323/224 |
| 6,188,211 B1 * | 2/2001 | Rincon-Mora | ........ | G05F 1/575 323/273 |
| 6,717,383 B1 * | 4/2004 | Brunt | ................... | A01K 63/047 239/18 |
| 6,914,991 B1 * | 7/2005 | Pompei | ................... | H04R 3/00 381/111 |
| 7,039,201 B1 * | 5/2006 | Lee | .......................... | H04S 7/40 381/58 |
| 7,348,854 B1 * | 3/2008 | Mordkovich | .......... | H03F 1/301 330/285 |
| 7,834,702 B2 * | 11/2010 | Jones | ........................ | H03F 1/02 330/136 |
| 9,520,782 B2 | 12/2016 | Pazhayaveetil et al. | | |
| 10,019,021 B1 * | 7/2018 | Lee | ........................... | G06F 1/08 |
| 10,021,485 B2 | 7/2018 | May et al. | | |
| 10,170,994 B1 * | 1/2019 | Gibney | ............... | H02M 3/1582 |
| 10,404,218 B2 * | 9/2019 | Baretich | ................. | H03F 3/183 |
| 2002/0011899 A1 * | 1/2002 | Organvidez | ............... | H03F 1/52 330/207 P |
| 2003/0001547 A1 * | 1/2003 | Jurzitza | ............... | H02M 3/1582 323/225 |
| 2004/0104711 A1 * | 6/2004 | Scoones | .................... | G05F 1/56 323/280 |
| 2004/0260416 A1 * | 12/2004 | Kellom | .................... | H03F 3/187 700/94 |
| 2006/0108993 A1 * | 5/2006 | Chien | ..................... | G05F 1/565 323/282 |
| 2007/0069765 A1 * | 3/2007 | Cummings | ............. | G06F 1/263 326/46 |
| 2008/0012638 A1 * | 1/2008 | Funaki | .................. | H03F 1/0205 330/136 |
| 2008/0159567 A1 * | 7/2008 | Lesso | ........................ | H02M 3/07 381/120 |
| 2008/0265853 A1 * | 10/2008 | Chen | ....................... | G05F 1/571 323/280 |
| 2009/0154733 A1 * | 6/2009 | Lesso | ........................ | H02M 3/07 381/120 |
| 2009/0243580 A1 * | 10/2009 | Chen | ..................... | H02M 3/156 323/288 |
| 2009/0278609 A1 * | 11/2009 | Srinivasan | ............ | H03F 1/0216 330/297 |
| 2010/0309689 A1 * | 12/2010 | Coulson | ............ | H02M 3/33507 363/16 |
| 2010/0315056 A1 * | 12/2010 | Sessions | ................. | G05F 1/575 323/284 |
| 2011/0241637 A1 * | 10/2011 | Parker | ..................... | H02J 9/061 323/282 |
| 2012/0218837 A1 * | 8/2012 | Dimartino | ............... | G05F 1/575 365/189.011 |
| 2012/0250379 A1 * | 10/2012 | D'Angelo | .......... | H05B 33/0815 363/78 |
| 2013/0003422 A1 * | 1/2013 | Persson | ................... | H02M 1/36 363/21.01 |
| 2013/0093505 A1 * | 4/2013 | Gupta | ...................... | G05F 1/575 327/540 |
| 2013/0163788 A1 * | 6/2013 | French | .................. | H02M 7/066 381/120 |
| 2013/0214831 A1 * | 8/2013 | Park | ....................... | G04F 10/005 327/156 |
| 2013/0321076 A1 * | 12/2013 | Galbis | .................. | H03F 1/0216 330/127 |
| 2014/0003616 A1 * | 1/2014 | Johnson | ............... | H04R 29/001 381/74 |
| 2014/0111276 A1 | 4/2014 | Mathe et al. | | |
| 2014/0266098 A1 * | 9/2014 | Dao | .......................... | G05F 1/573 323/273 |
| 2014/0369529 A1 * | 12/2014 | Quinn | ................... | H03F 1/0233 381/121 |
| 2015/0030183 A1 * | 1/2015 | Pazhayaveetil | ........ | H03G 3/004 381/120 |
| 2015/0155833 A1 * | 6/2015 | Cowley | ............... | H04L 25/0264 330/10 |
| 2015/0188502 A1 * | 7/2015 | Lee | ......................... | H03F 3/185 381/120 |
| 2015/0349631 A1 * | 12/2015 | Potanin | ................ | G05B 13/042 323/282 |
| 2015/0378412 A1 * | 12/2015 | Suryanarayanan | ... | G06F 1/3206 713/340 |
| 2016/0197588 A1 * | 7/2016 | Olson | ..................... | H03F 3/185 381/120 |
| 2017/0110963 A1 * | 4/2017 | Mattingly | ............... | G01R 31/40 |
| 2017/0118558 A1 * | 4/2017 | Renken | ..................... | H04R 25/30 |
| 2017/0288610 A1 * | 10/2017 | de Vries | ................. | H03F 1/0222 |
| 2017/0359652 A1 * | 12/2017 | Serwy | ..................... | H03F 3/183 |

(56) References Cited

U.S. PATENT DOCUMENTS

| | | | |
|---|---|---|---|
| 2018/0198430 A1* | 7/2018 | Link | H03F 1/025 |
| 2018/0248525 A1* | 8/2018 | Orr | H03F 1/0227 |
| 2018/0294787 A1* | 10/2018 | Li | H04R 3/00 |
| 2019/0013735 A1 | 1/2019 | King et al. | |
| 2019/0089245 A1 | 3/2019 | King et al. | |

FOREIGN PATENT DOCUMENTS

| | | |
|---|---|---|
| GB | 2527419 A | 12/2015 |
| JP | 2013058993 A | 3/2013 |
| WO | 2007082388 A1 | 7/2007 |

OTHER PUBLICATIONS

International Search Report and Written Opinion of the International Searching Authority, International Application No. PCT/GB2018/050364, dated Apr. 25, 2018.

Combined Search and Examination Report under Sections 17 and 18(3), UKIPO, Application No. GB1902354.8, dated Aug. 20, 2019.

* cited by examiner

AMPLIFIERS

This application is a continuation of U.S. patent application Ser. No. 15/903,734, filed Feb. 23, 2018, which claims priority to U.S. Provisional Patent Application Ser. No. 62/464,695, filed Feb. 28, 2017, and United Kingdom Patent Application Serial No. 1704282.1, filed Mar. 17, 2017, each of which is incorporated by reference herein in its entirety.

TECHNICAL FIELD

This application relates to amplifier circuits and to methods and apparatus for supplying power to an amplifier circuit, such as a Class-D amplifier circuit, especially for battery powered applications.

BACKGROUND

Many electronic devices have audio amplifiers for generating an audio driving signal for an output transducer, e.g. a loudspeaker, which may for example be an on-board output transducer of the electronic device itself.

FIG. 1a illustrates one example of an amplifier circuit 100 as may be implemented in a battery powered device, for example a portable device such as a mobile telephone or smartphone or tablet computer or the like. A battery 101, in use, provides a power source, at least during some use cases where other sources of power are not available. Power from the battery 101 may typically, at least in some instances, be regulated by a voltage regulator, such as a DC-DC converter 102 which may, for instance, be a boost regulator as would be understood by one skilled in the art. As such a DC-DC converter 102 is a switched power supply, an output capacitor 103 is provided to maintain the voltage at the output of the DC-DC converter 102 across each switching cycle. This voltage maintained at the output of the DC-DC converter 102 is provided as a supply voltage $V_S$ to the amplifier 104.

The amplifier 104 may, in some instances be a Class-D amplifier, as Class-D amplifiers are generally quite power efficient, and power efficiency is typically an important consideration for portable electronic devices. However other types of amplifier could be used in some implementations.

The amplifier 104 receives an input signal $S_{IN}$ (which for a Class-D amplifier may be a digital signal) and amplifies the signal to provide a driving signal for driving a load 105, for instance a loudspeaker of the host device (i.e. the device of which the amplifier circuit 100 forms a part).

As will be understood by one skilled in the art the supply voltage $V_S$ provided to the amplifier should be sufficient for the amplifier to be able to amplify the input signal without clipping, allowing headroom for amplifier output stage voltage compliance and DC-DC converter output voltage ripple, at least within an expected range of input signal amplitudes.

With a battery powered device however there may be a battery current limit specifying the maximum current that should be drawn, in use, from the battery 101. Typically therefore the DC-DC converter 102 may have an input current limit which is set so as to ensure that the input current to the DC-DC converter 102 does not exceed the battery current limit.

This input current limit effectively limits the power that the DC-DC converter 102 can output and hence correspondingly the audio power that can be output from the amplifier 104.

Increasingly the audio performance specifications for some electronic devices may be such that a DC-DC converter 102 may be unable to meet the power demand of the amplifier 104 at peak levels of audio signal $S_{IN}$ without exceeding the battery current limit for practical batteries 101 that may be used in such electronic devices. Thus, to avoid unwanted signal clipping without exceeding the battery current limit may require the peak signal level achieved in use to be reduced to below that which would be desired.

Embodiments of the present disclosure are thus directed at methods and apparatus for signal amplification that at least mitigate at least some of the above mentioned issues.

Thus according to the present invention there is provided an amplifier circuit for amplifying an audio signal, comprising:
  a voltage regulator having an input node for receiving an input voltage and an output node for outputting an output voltage, the voltage regulator comprising an output capacitor coupled to the output node;
  an amplifier connected to receive the output voltage from said output node of the voltage regulator as a supply voltage;
  the voltage regulator being operable in a voltage-control mode to maintain the output voltage at a nominal output voltage and in current-control mode to apply current limiting so as to limit an input current drawn by the voltage regulator via the input node so as not to exceed a defined input current limit; and
  a controller for defining the nominal output voltage;
  wherein the controller is operable in a first mode to define the nominal output voltage so as not to exceed a first voltage magnitude and is operable in a second mode to define the nominal output voltage to be equal to a second voltage magnitude, the second voltage magnitude being greater than the first voltage magnitude;
  wherein the controller is configured to monitor an indication of the level of the audio signal for a high-amplitude part of the audio signal that could result in the voltage regulator operating in the current-control mode to apply current limiting; and wherein the voltage controller is configured to operate in said first mode until such a high-amplitude part of the audio signal is detected and, on such detection to operate in the second mode of operation until such a high-amplitude part of the audio signal has been amplified;
  wherein the second voltage magnitude is greater than required for voltage headroom for amplifying the high-amplitude part of the audio signal so as to allow for a voltage droop of the output voltage over a plurality of switching cycles of the voltage regulator when operating in the current-control mode.

On detection of a high-amplitude part of the audio signal, the controller may be configured to change to the second mode of operation such that the output capacitor is substantially charged to the second voltage magnitude before the high-amplitude part of the audio signal is amplified by the amplifier.

In some embodiments the controller is configured to detect a high-amplitude part of the audio signal by determining when the indication of the level of the audio signal exceeds a first threshold corresponding to a signal level that would be expected to lead to the voltage regulator operating in the current-control mode to applying current limiting. The circuit may comprise a threshold generator for determining the first threshold. The threshold generator may be configured to determine the first threshold based on the defined input current limit. In some instances the defined input current limit may be configurable and, for instance, may be configured to vary with a battery voltage at the input node.

The threshold generator may be configured to determine said the threshold based on at least one of: voltage regulator efficiency; amplifier efficiency; audio load impedance; audio load inductance; a minimum audio frequency; and amplifier gain. The controller may comprise a comparator for comparing the indication of the level of the audio signal with the first threshold.

In some instance the second voltage magnitude is greater than required for voltage headroom for amplifying the high-amplitude part of the audio signal so as to allow for a voltage droop of the supply voltage of at least 10% or at least 15%.

The controller may be configured such that in the first mode of operation the nominal output voltage provides a nominal headroom of 15% or less, or 10% or less, of the magnitude of the nominal output voltage. The nominal headroom is the voltage difference between the nominal output voltage and the maximum output voltage of the amplifier, in this case the maximum output voltage of the amplifier in the first mode of operation.

The controller may be configured such that in said second mode of operation the nominal output voltage provides a nominal headroom of at least 20%, or at least 25%, of the magnitude of the nominal output voltage. The nominal headroom, in this case, is the voltage difference between the nominal output voltage and the maximum output voltage of the amplifier in the second mode of operation.

The controller may be configured to receive a version of the audio signal and to determine the indication of the level of the audio signal. The amplifier circuit may comprise an envelope detector for receiving the version of the audio signal and determining an envelope value as the indication of the level of the audio signal.

In some embodiments there is a delay in a signal path for the audio signal upstream of the amplifier. The delay may comprise a buffer of configurable size. The delay may have a delay duration which is at least equal to the time that would be required for the output capacitor to be charged to from a lowest expected voltage level in the first mode of operation to the second voltage magnitude.

In some implementations, in the first mode of operation, the controller is configured to vary the nominal output voltage of the voltage regulator based on the indication of the level of the audio signal.

In some implementations, in the first mode of operation, the controller may be operable to control the voltage regulator in a pass-through mode to pass the input voltage directly to the output node as the supply voltage if the indication of the level of the audio signal is below a second threshold.

The voltage regulator may comprises a DC-DC converter. The controller may be configured to vary a voltage reference signal supplied to the DC-DC converter to define the nominal output voltage.

The amplifier circuit may be implemented as an integrated circuit. The amplifier circuit may, in use, comprise a loudspeaker configured to be driven by the amplifier. In some implementations there may be a battery and the input node of the voltage regulator may be coupled to receive the input voltage from said battery. The defined input current limit may correspond to a battery current limit.

Aspects relate to electronic device comprising an amplifier circuit as described in any of the variants discussed above. The electronic device may be at least one of: a portable device; a battery operated device; a communication device; a mobile or cellular telephone device; a smartphone; a computing device; a laptop, notebook or tablet computing device; a gaming device; a personal media player; a wearable device.

In another aspect there is provided an amplifier circuit for amplifying an audio signal, comprising:
  an amplifier;
  a voltage regulator having an input node for receiving an input voltage and an output node for outputting a supply voltage to said amplifier, the voltage regulator comprising an output capacitor coupled to the output node;
  the voltage regulator comprising a voltage control loop for controlling the voltage at the output node to a nominal output voltage and a current control loop for, when activated, limiting an input current drawn by the voltage regulator via the input node so as not to exceed a defined input current limit, wherein the voltage regulator operates according to the voltage control loop unless the current control loop is activated; and a controller for defining the nominal output voltage;
  wherein the controller is operable in a first mode to define the nominal output voltage so as not to exceed a first voltage magnitude and is operable in a second mode to define the nominal output voltage to be equal to a second voltage magnitude, the second voltage magnitude being greater than the first voltage magnitude;
  wherein the controller is configured to monitor an indication of the level of the audio signal for a high-amplitude part of the audio signal that could result in the current control loop of the voltage regulator being activated; and
  wherein the controller is configured to operate in said first mode until such a high-amplitude part of the audio signal is detected and, on such detection to operate in the second mode of operation until such a high-amplitude part of the audio signal has been amplified;
  wherein the second voltage magnitude is greater than required for voltage headroom for amplifying the high-amplitude part of the audio signal so as to allow for a voltage droop of the supply voltage over a plurality of switching cycles of the current control loop dominating the voltage control loop.

In a further aspect there is an amplifier circuit for amplifying an audio signal, comprising:
  an amplifier;
  a voltage regulator having an input node for receiving an input voltage and an output node for outputting a supply voltage to said amplifier, the voltage regulator comprising an output capacitor coupled to the output node;
  the voltage regulator being operable to apply current limiting so as to limit an input current drawn by the voltage regulator via the input node so as not to exceed a defined input current limit;
  a controller for defining a nominal output voltage generated by the voltage regulator;
  wherein the controller is operable to compare an indication of the level of the audio signal to a first threshold, wherein the first threshold is indicative of the input signal that, if amplified by the amplifier, would be expected to lead to the voltage regulator experiencing current limiting; and
  in the event that the indication of the level of the audio signal exceeds said first threshold to increase the magnitude of the nominal output voltage of the voltage regulator from a first operating range to a second higher voltage level.

A yet further aspect provides an amplifier circuit for amplifying an audio signal, comprising:

an amplifier;

a voltage regulator having an input node for receiving an input voltage and an output node for outputting a supply voltage to said amplifier, the voltage regulator comprising an output capacitor coupled to the output node;

the voltage regulator being operable to apply current limiting so as to limit an input current drawn by the voltage regulator via the input node so as not to exceed a defined input current limit;

a threshold generator for generating a first threshold indicative of an audio signal level that would be expected to lead to current limiting being applied by the voltage regulator; and a controller for controllably varying a nominal output voltage generated by the voltage regulator;

wherein the controller is operable in a first mode to control the nominal output voltage so as not to exceed a first voltage magnitude and in a second mode to control the nominal output voltage to be equal to a second voltage magnitude, the second voltage magnitude being greater than the first voltage magnitude;

wherein the controller operates in the first mode unless and until the indication of the level of the audio signal exceeds the first threshold and then changes to the second mode of operation until a predetermined time after the level of the audio signal has dropped back below the first threshold.

In another aspect there is an amplifier circuit for amplifying an audio signal, comprising:

an amplifier;

a voltage regulator having an input node for receiving an input voltage and an output node for outputting a supply voltage to said amplifier, the voltage regulator comprising an output capacitor coupled to the output node;

the voltage regulator being operable to apply current limiting so as to limit an input current drawn by the voltage regulator via the input node so as not to exceed a defined input current limit; and a controller for controlling a nominal output voltage generated by the voltage regulator;

wherein the controller is operable in a first mode to control the nominal output voltage so as not to exceed a first voltage magnitude and is operable in a second mode to control the nominal output voltage to be equal to a second voltage magnitude, the second voltage magnitude being greater than the first voltage magnitude;

wherein the controller is configured to monitor an indication of the level of the audio signal for a high-amplitude part of the audio signal that could result in the voltage regulator applying current limiting; and wherein the controller is configured to operate in said first mode until such a high-amplitude part of the audio signal is detected and, on such detection to operate in the second mode of operation until such a high-amplitude part of the audio signal has been amplified;

wherein the second voltage magnitude is greater than required for standard voltage headroom for amplifying the high-amplitude part of the audio signal.

In another aspect there is an amplifier circuit for amplifying an audio signal, comprising:

an amplifier;

a voltage regulator having an input node for receiving an input voltage and an output node for outputting a supply voltage to said amplifier, the voltage regulator comprising an output capacitor coupled to the output node;

the voltage regulator being operable to apply current limiting so as to limit an input current drawn by the voltage regulator via the input node so as not to exceed a defined input current limit; and a controller for controlling a nominal output voltage generated by the voltage regulator;

wherein the controller is configured to monitor an indication of the level of the audio signal for a high-amplitude part of the audio signal above a first threshold; and wherein the controller is configured to operate in a first mode until such a high-amplitude part of the audio signal is detected and, on such detection to operate in the second mode of operation until such a high-amplitude part of the audio signal has been amplified;

wherein in the first mode of operation the nominal output voltage provides a nominal voltage headroom of 10% or less of the magnitude of the nominal output voltage; and wherein in the second mode of operation the nominal output voltage provides a nominal voltage headroom of at least 25% of the magnitude of the nominal output voltage.

BRIEF DESCRIPTION OF DRAWINGS

To explain various aspects of the present disclosure various embodiments will now be described, by way of example only, with reference to the accompanying drawings, of which.

DETAILED DESCRIPTION

Figure 1A:
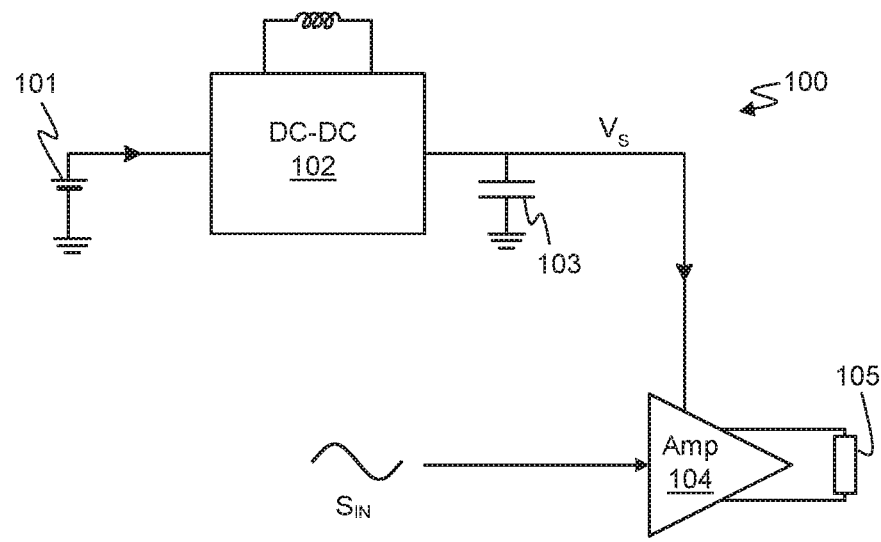
FIG. 1A illustrates a conventional amplifier arrangement and FIGS. 1*b* and 1*c* illustrate conventional operation of a DC-DC converter that may be used to supply an amplifier.

Referring to FIG. 1*a*, as discussed above, the audio performance requirements for some battery powered electronic devices, e.g. portable electronic devices such as tablet computers or mobile phones, may be such that increasingly that a voltage regulator, e.g. comprising DC-DC converter 102, which regulates power supply to the amplifier 104, may not be able to supply sufficient power at peak signal levels of input signal $S_{IN}$ without exceeding a battery current limit for current draw from the battery 101. In essence an input current limit $I_{lim}$ for the DC-DC converter 102, which may be set based on a specified battery current limit value, results in a limit in the output current that the DC-DC converter can supply. Consequently there is a maximum output voltage level that can be driven from the amplifier to a particular load, given the characteristics of the load, without requiring more output current from the DC-DC converter 102 than it can supply.

Figure 1B:
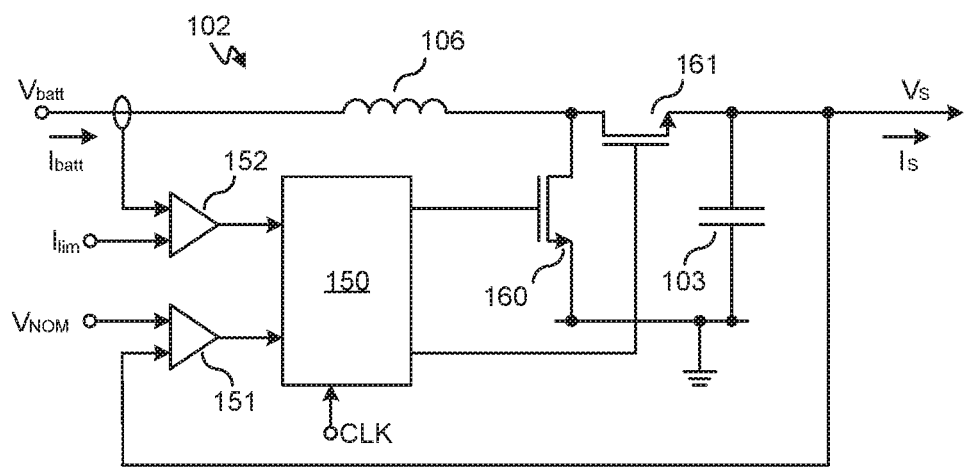

FIG. 1b illustrates an example DC-DC converter 102, in this case a boost converter, which provides an output supply current $I_S$ at a converter output node, in turn pulling a current $I_{batt}$ from a battery which provides a battery voltage $V_{batt}$. This battery voltage may be provided either directly from the battery 101 or via some decoupling network (not illustrated). The battery voltage is applied to an inductor 106 which is also connected to switches 160 and 161. Control terminals of switches 160 and 161 are connected to switch controller 150 which may receive a clock signal CLK.

The switch controller 150 controls the operation of switches 160 and 161. With switch 160 active, i.e. on, and switch 161 off, the inductor is connected between the battery voltage and a reference, typically ground. This allows the current in the inductor 106 to build up. With switch 160 off and switch 161 on or active the inductor is instead connected to the output node and the current stored in the inductor passes to the output terminal and recharges the output capacitor 103. The switch controller 150 thus controls the switches 160 and 161 to operate the DC-DC converter in at least two switch states: a first switch state with switch 160 off and switch 161 on where stored current is supplied from the inductor to the output; and a second switch state with switch 160 on and switch 161 off where current is being stored in the inductor.

The output voltage $V_S$ is fed-back to a first error amplifier 151 and compared to a nominal output voltage $V_{NOM}$ and a resultant voltage error signal is provided to the controller 150 which consequently adjusts the timing of pulses to the control terminals of the switches 160 and 161 so as to close a first, voltage-control, feedback loop to regulate the output voltage $V_S$ to be close to $V_{NOM}$. In some instances the controller 150 may switch to a defined one of the first or second switch states based on the clock signal and then swap to the other switch state based on the feedback error signal. A switching cycle is thus defined by the clock signal with the duty cycle of a particular switch state within the switching cycle being determined by the error feedback loop.

Many circuits for providing this feedback loop are known. It will be noted that FIG. 1b illustrates the output voltage $V_S$ being compared to the desired nominal voltage but it will be understood that a level shifted version of the output voltage could be compared to a suitable reference. In general though the voltage control loop including first error amplifier 151 operates to maintain the output voltage, as far as possible, at the level of the nominal output voltage.

Figure 1C:
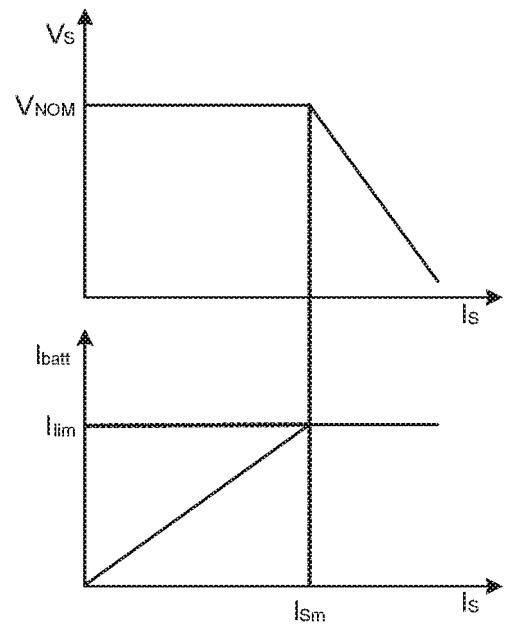

If the load current increases, then the current $I_{batt}$ taken from the battery will also increase as illustrated in FIG. 1c. At some point the current draw may increase to a value $I_{lim}$ that is the maximum specified current that is allowed to be taken from the battery by the DC-DC converter (possibly taking into account other anticipated loading of the battery).

To provide current limiting the battery current drawn may be monitored and compared to $I_{lim}$ by a second error amplifier 152. If the drawn battery current $I_{batt}$ is less than $I_{lim}$ then the output of error amplifier 152 has no effect on the pulse outputs of switch controller 150, i.e. the timing or duty-cycles of the switch states. However if $I_{batt}$ attempts to exceed $I_{lim}$ then a current-control loop via error amplifier 152 is arranged to dominate the voltage-control feedback loop and to keep $I_{batt}$ close to him despite any resulting decrease in the output voltage $V_S$.

Thus the DC-DC converter 102 can, in general, operate in either a voltage-control mode or a current-control mode i.e. an active current-limiting mode, depending on the current demanded from the battery and thus indirectly on the current required to supply the load. In the voltage-control mode the current control loop, i.e. error amplifier 152, has no substantially active effect on the switch states and the output voltage generated at the output node of the voltage regulator is controlled to be substantially equal to the defined nominal voltage $V_{NOM}$. In the current-control mode however the switching of the switch states may be modified by the current control loop to avoid exceeding the input current limit.

When used to provide a supply voltage to an amplifier 104, as illustrated in FIG. 1a, it will be understood that as the signal voltage to be applied to a given load increases the current required increases. Consequently, there is a maximum output voltage level that can be driven from the amplifier 104 to a particular load, given the characteristics of the load, without requiring more output current from the DC-DC converter 102 than it can supply due to the constraint on its input current.

One way to overcome this issue would be to use a dedicated energy storage element, such as a capacitor, to store energy to support the load demand in such circumstances. The energy storage element could be coupled to the voltage supply rail for the amplifier 104. In the event that the DC-DC converter 102 can meet the load demand the energy storage element would remain charged. However if the DC-DC converter entered an active current limiting mode of operation, i.e. the input current limit for the DC-DC converter 102 was reached and the DC-DC converter was unable to meet the load demand, the energy storage element could supply additional charge to effectively make up the shortfall.

The energy storage element could be a capacitor in addition to the output capacitor 103. However this would require the presence of an additional capacitor, which would add to the cost and size of the circuitry and may require additional integrated circuit contact terminals, e.g. pins. For portable electronic devices size of the various components and the resulting PCB area occupied can be another important consideration.

The amplifier circuit 100 could therefore be operated to use the output capacitor 103 as an energy storage capacitor which is sufficient to store energy to support the load when the DC-DC converter 102 experiences current limiting. However, to provide a useful amount of energy storage, the capacitance of the output capacitor 103 would need to be relatively large, for instance significantly larger than conventionally may be used just to maintain the output voltage of the DC-DC converter 102 across each cycle of the various switch states of the DC-DC converter.

As discussed with reference to FIG. 1b a DC-DC converter, such as a boost converter or the like, typically switches between at least two switch states in a cycle to provide the required output voltage. In a first state of the DC-DC converter, a voltage is developed at the output of the DC-DC converter to meet the load demand and (in normal operation) charge the output capacitor. In a second state the DC-DC converter is effectively charging/discharging other components such as an inductor and the output capacitor at least partially supports the load demand. In normal, non-current limited operation, i.e. under voltage-control, the switching cycle is controlled, in line with the loading on the DC-DC converter, to provide the desired nominal output voltage. The output capacitor 103 is typically chosen to be just large enough to support the load demand between instances of the first state, i.e. between instances of the output capacitor being re-charged, e.g. during instances of the second state, with an acceptable voltage ripple for the highest expected load demand, but assuming that, on average, the DC-DC converter can meet the power demand. The output capacitor 103 would thus not normally be large enough to supply charge over a prolonged period of time, comprising many switching cycles, where the DC-DC converter itself was unable to meet the power demand without an unacceptable voltage droop.

Thus, as mentioned, one could consider using an output capacitor that is significantly larger than one that would conventionally be used in order to store additional charge. However using a significantly larger capacitance for the output capacitor 103 would itself result in increased size and cost and may be undesirable.

Instead therefore the voltage output from the DC-DC converter 102, i.e. the nominal output voltage $V_S$, may be significantly increased compared to what otherwise might be required for the amplifier 104.

It will be understood that conventionally the DC-DC converter 102 may be operated to provide a supply voltage $V_S$ which has sufficient voltage headroom for the amplifier 104 to amplify to a desired peak signal voltage given the normal expected voltage ripple.

Figure 2A:
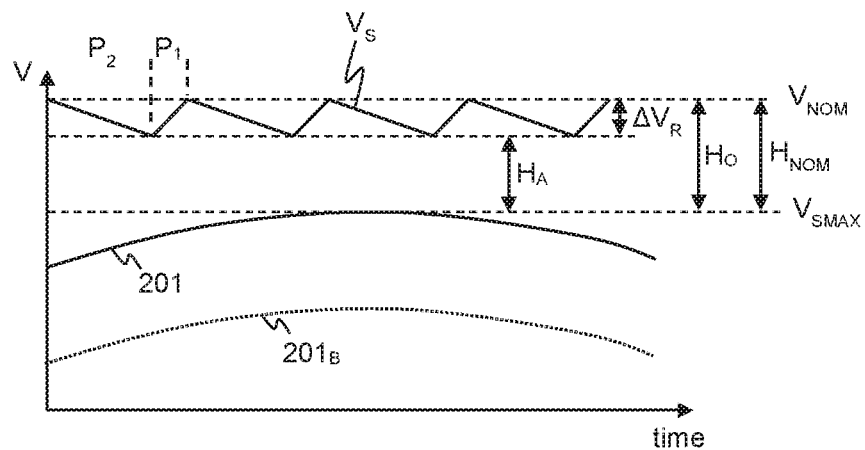
FIGS. 2*a* and 2*b* illustrate example voltage waveforms illustrating respectively the concepts of voltage ripple and headroom and using a high fixed supply voltage for an amplifier.

FIG. 2a illustrates the principles of headroom and ripple voltage. FIG. 2a illustrates the supply voltage $V_S$ and a plot 201 of output voltage from the amplifier 104. As mentioned above the DC-DC converter 102 will generally be a switched power supply that repeatedly cycles through a sequence of switch states including a first state in which the nominal output voltage $V_{NOM}$ is developed at the output of the DC-DC converter 102 and a second state in which the output capacitor at provides at least some of the output load current load to maintain the supply voltage. Thus there will be repeating cycle including periods P1 of the first state and periods P2 of the second state. During a period P2 of the second state the output capacitor 103 is supporting the load and being discharged, there is thus a slight droop in the supply voltage $V_S$ over this period P2 that depends on the loading. During a period P1 of the first switch state the voltage at the output of the DC-DC converter 102 recharges the output capacitor. This results, over the switching cycle, in a voltage ripple of magnitude $\Delta V_R$. The switching frequency and/or duty cycle of the DC-DC converter 102, i.e. durations of periods P1 and P2, is controlled so that the output capacitor is recharged, as far as possible, to $V_{NOM}$ each cycle and the magnitude of the voltage ripple $\Delta V_R$ at the worst case loading is within acceptable limits. Note that the magnitude of the voltage droop and the duration of the switching period with respect to variations in the output signal (which is an amplified version of the input signal $S_{IN}$) are exaggerated in FIG. 2a in order to explain the principles.

For amplifier 104 to correctly amplify the input signal $S_{IN}$ without clipping, the supply voltage $V_S$ to the amplifier should allow for a certain amplifier headroom $H_A$ on top of the amplified output signal 201. This amplifier headroom HA is effectively the minimum additional voltage required to allow correct operation of the amplifier, for instance to allow for the voltage drop arising from the on-resistance of the output transistors of the amplifier. The amount of headroom required for a given amplifier will depend on the amplifier design and may also depend on signal level and also on operating conditions. The amplifier headroom $H_A$ required may therefore be defined for an amplifier based on the minimum headroom required, under worst case expected operating conditions, at the maximum expected output signal level $V_{SMAX}$. To allow for manufacturing tolerances of various circuit components and uncertainty in the operating conditions, a certain tolerance may be included in the amplifier headroom $H_A$, however this is usually relatively small as it is generally preferred to keep the nominal supply voltage as low as practical. One skilled in the art would readily understand how to determine an appropriate amplifier headroom $H_A$ for a particular amplifier implementation.

The voltage ripple $\Delta V_R$ together with the amplifier headroom $H_A$ can be seen as collectively defining an operating headroom $H_O$ which is required for correct amplification of the signal. As used herein the term operating headroom $H_O$ will thus be used to refer to the minimum headroom required between the nominal output voltage $V_{NOM}$ and the maximum output signal level $V_{SMAX}$ for correct operation, based on the worst case expected operating conditions ($H_O = \Delta V_R + H_A$).

The nominal output voltage $V_{NOM}$ of the DC-DC converter may therefore be set based on the determined operating headroom $H_O$ required for the relevant circuit and the maximum expected output signal level $V_{SMAX}$.

In some embodiments the maximum expected output signal level $V_{SMAX}$ may be limited by physical constraints of the audio signal path, in other words by limiting the maximum allowed level of the input signal $S_{IN}$. The range of the input signal $S_{IN}$ may be limited, for instance, by the output range of components upstream of amplifier 104 in the signal path. For example a maximum input signal level may be determined, at least partly, by the highest gain setting of a variable gain element that provides some volume control and/or a full-scale output voltage and/or maximum modulation factor of a DAC in the signal path. In some embodiments however a maximum input signal level may be a notional design limit; that is the amplifier circuit will be designed to be able to amplify any signal up to a maximum input level without clipping but may physically, in some instances, be able to be operated to supply a higher signal level to the amplifier, albeit with a risk or likelihood of signal clipping.

The term nominal headroom $H_{NOM}$ will be used herein to refer to the actual difference between the nominal output voltage $V_{NOM}$, i.e. the nominal supply voltage, and the maximum expected output signal level $V_{SMAX}$ ($H_{NOM} = V_{NOM} - V_{SMAX}$). The nominal headroom $H_{NOM}$ for an amplifier circuit should thus be set to be at least equal to the required operating headroom $H_O$. The nominal headroom can thus be seen as an indication of the minimum actual headroom that may be expected in use (if the supply voltage were at the nominal output voltage level and the output signal were at the expected maximum level $V_{SAX}$). In the example illustrated in FIG. 2a the nominal headroom $H_{NOM}$ is arranged to be equal to the operating headroom $H_O$ required.

It will also be appreciated that the actual voltage difference between the output signal and the supply voltage will vary over time as the signal level changes and if the output signal level at a given point in time is lower than the expected maximum level $V_{SMAX}$, e.g. as represented by the dotted line $201_B$, the actual voltage difference between the output signal 201 at that time and the supply voltage $V_S$ may be much greater than required (but the nominal headroom is defined with regard to the maximum signal level and does not vary).

In some amplifier designs, as will be discussed in more detail below, the value of the nominal output voltage $V_{NOM}$ of the DC-DC converter 102, i.e. the nominal supply voltage, may be varied in use to reduce when the signal level reduces so as to reduce any excess actual headroom. If the nominal output voltage $V_{NOM}$ is arranged to vary with signal level, for example in Class-G or Class-H modes of operation, the relevant maximum expected output signal level at any given time will be the maximum output signal level at which that respective nominal supply voltage at that time is used. In other words in a system where the nominal supply voltage changes with signal level there will be a nominal headroom associated with each nominal output voltage based on the maximum signal level that corresponds to that output voltage.

As an example in some implementations a battery voltage of around 3V may be boosted to a supply voltage $V_S$ of around 8V to be suitable for a Class-D amplifier driving an on-board loudspeaker. In normal operation the magnitude of the voltage ripple $\Delta V_R$ may be of the order of 100 mV or so in some implementations. The required amplifier headroom may be of the order of a few hundred millivolts, say around 200 mV in some implementations to allow for the on-resistance of output transistors of the size that may be typically used and also some possible constraint on the maximum and minimum duty cycle of the periods P1/P2. The operating headroom $H_O$ may therefore be of the order of a few hundred mv. The nominal headroom for such an amplifier may therefore be set to be of the order of 500 mV or so to cope with this expected voltage ripple and amplifier voltage drop. The maximum output signal level, when using the 8V supply voltage, may therefore be limited to around 7.5V. This may be seen as standard headroom, where the nominal headroom is of the same sort of magnitude as the required operating headroom, i.e. any excess headroom at the maximum signal level is relatively small.

In order to provide reasonable energy storage in the output capacitor 103, without requiring an unduly large capacitance, the DC-DC converter instead may be operated with a significantly higher output voltage, say of the order of 12V. The supply voltage could therefore be set at a level which is significantly greater than required for voltage ripple and amplifier headroom HA reasons.

In use, the DC-DC converter 102 would supply power to the amplifier 104 as described previously but in this case the supply voltage would be a fixed relatively high voltage supply, say a supply of 12V. The input current limit for the DC-DC converter 102 would be set to ensure that the current draw from the battery does not exceed the battery current limit. In at least some operating conditions, e.g. at relatively low signal levels, the power draw by amplifier 104 may be such that the current demand can be met by DC-DC converter 102 without exceeding the input current limit. If, however, the operating conditions change, e.g. the audio signal level approaches a peak signal level, the DC-DC converter 102 may enter a current limited mode of operation where the input current to the DC-DC converter is actively being limited. In this case the output current from the DC-DC converter 102 may be insufficient to meet the demand from the amplifier 104, however the extra energy stored in the output capacitor will support the load demand.

Figure 2B:
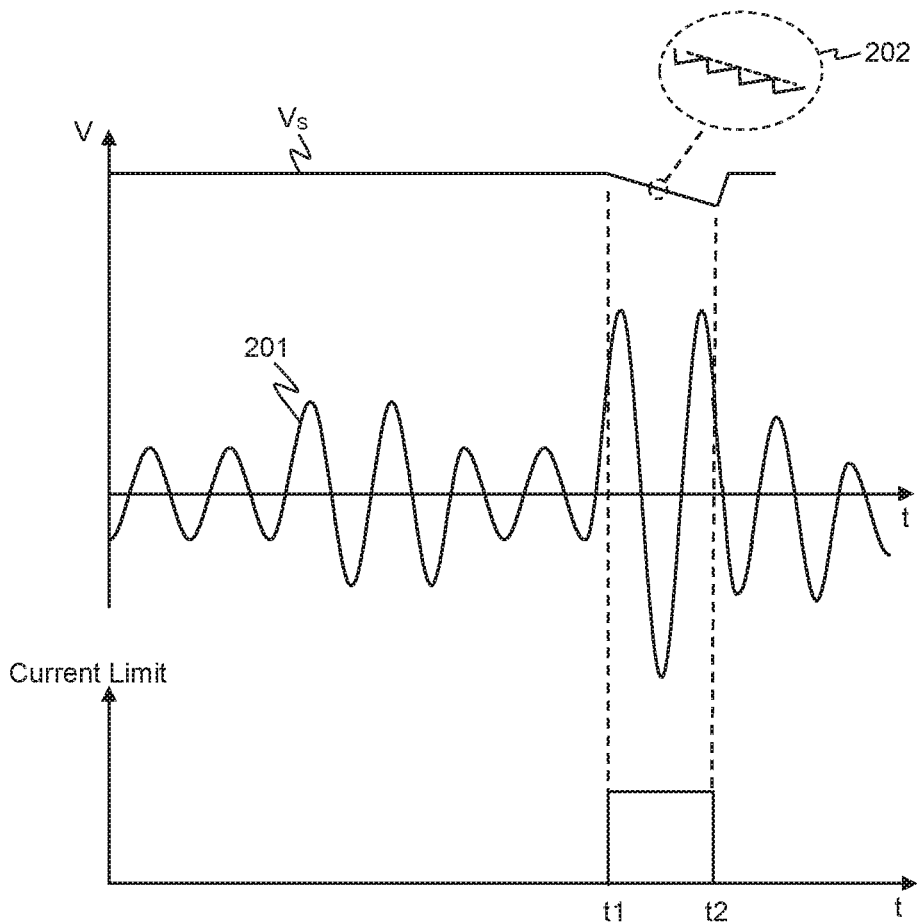

FIG. 2b illustrates the principles of such operation. FIG. 2b indicates a plot 201 representing the output signal from amplifier 104 over time. Also shown is the supply voltage $V_S$ and how it varies over time. The lower plot of FIG. 2b represents an indication of when current limiting is active in the DC-DC converter 102, e.g. the DC-DC converter has swapped from a normal voltage mode of control to a current-mode control. Note it will be understood that a current limit monitor (e.g. the second error amplifier 152 of FIG. 1b) will normally operate continuously when the DC-DC converter is operating to ensure that the relevant input current limit is not exceeded. Thus current limiting control or monitoring may always be operating, however as used herein the term current limiting or a current limited mode of operation shall be used to mean that input current is actively being limited, i.e. reduced compared to what the input current would be in the absence of the current limiting control. Current limiting can be said to be active if the present input current depends, at that time, on the input current limit defined for the DC-DC converter 102. For the example DC-DC converter illustrated in FIG. 1b current limiting can be said to be active if the switch controller 150 is responsive to the output of the current control loop, i.e. the output of second error amplifier 152, to override the timing indicated by the voltage error feedback loop, i.e. output of first error amplifier 151.

At the start of the time period illustrated by FIG. 2b the supply voltage $V_S$ is at a high fixed level, say 12V. Note that FIG. 2b is concerned with changes on the timescale of the audio input signal $S_{IN}$ and not on the much faster switching frequency of the DC-DC converter and ignores any ripple voltage associated with the switching phases of the DC-DC converter 102 for clarity, however an indication of how the actual voltage may vary is illustrated in the expanded section 202. Initially, up to a time t1, the power demand of the amplifier 104 can be met by the DC-DC converter 102 without exceeding the input current limit. At time t1 however the signal level of the amplified output signal 201 has reached a level where the DC-DC converter 102 reaches the input current limit. After this time, until time t2, the DC-DC converter is experiencing current limiting and the DC-DC converter 102 cannot meet the full current demand. However the output capacitor 103 can supply charge to ensure that the full current demand is met. As such the voltage of the supply voltage $V_S$ as maintained by the output capacitor 103 may begin to droop (over several switching cycles of the DC-DC converter). However as the initial supply voltage was significantly higher than required by the amplifier 104 the amplifier 104 still continues to operate correctly. At time t2 the signal level reduces to a level where the DC-DC converter 102 can meet the power demand without current limiting. The output capacitor is thus recharged back up to the high output voltage of the DC-DC converter 102, e.g. 12V, and is thus ready support load demand for another subsequent signal peak.

Whilst such an approach may provide the ability to meet the peak audio demand whilst not exceeding a battery current limit, it does however require a relatively high supply voltage to be maintained, which is not desirable for power efficiency. As noted above the DC-DC converter 102 should be operated to provide a supply voltage $V_S$ which has sufficient voltage headroom for the signal being amplified. However if the difference between the signal being amplified and the supply voltage $V_S$ is greater than a required voltage headroom, i.e. there is excess headroom, then there may be unnecessary power wastage in the amplifier. Also the DC-DC converter may consume more power when operating with a higher output voltage.

Operating with a higher supply voltage than is necessary for standard headroom reasons thus tends to reduce power efficiency as inherently more power is wasted in amplifier operation and the DC-DC converter.

Embodiments of the present disclosure relate to an amplifier arrangement in which an amplifier receives power from a voltage regulator and a controller is configured to receive an indication of the level of a signal to be amplified by the amplifier and to determine whether the signal to be amplified is likely to result in the voltage regulator experiencing current limiting. In the event that it is determined that current limiting being applied at the voltage regulator is likely, e.g. based on known or assumed system parameters, and thus the voltage regulator may be unable to meet the power demand from the amplifier, then the amplifier circuit may operate with the voltage regulator outputting a defined high output voltage. This defined high voltage may be a relatively high voltage, which is higher than required just for standard voltage headroom reasons, in order to store energy in a capacitor or other energy storage element coupled to the supply voltage rail in a similar manner as described with reference to FIG. 2b. However when it is determined that voltage regulator is unlikely to enter a current limiting mode of operation, and the power demand of the amplifier may be met by the voltage regulator itself, there may be no need to store such additional energy in an output capacitor or similar. At such times therefore the voltage output from the voltage regulator may be reduced from the defined high voltage, and possibly significantly reduced, and may be set based on the expected signal level and standard headroom. The voltage regulator may comprise a DC-DC converter.

Thus for example, as mentioned above a supply voltage of 8V may be a suitable for a Class-D amplifier for driving a loudspeaker when the DC-DC converter is not operating in a current limited mode of operation, e.g. for a first range of signal amplitudes. If the controller determines that the DC-DC converter will not operate in a current limited mode of operation the DC-DC converter may be operated to provide an output voltage of 8V. If however it is determined that a high level part of the input signal will likely cause the power demand from the amplifier to result in the DC-DC converter experiencing current limiting, then the output voltage from the DC-DC converter may be increased to the defined high voltage, say 12V, to store energy in the output capacitor. This defined high voltage may be significantly higher than required for standard headroom reasons. The output voltage is increased to the defined high voltage in sufficient time before the high signal level part of the signal reaches the amplifier, such that there is time to charge the output capacitor, or other storage element, to the defined high voltage to store charge to support the power demand (for when the DC-DC converter does enter current limiting). Thus the controller may be part of, or responsive to, a look ahead module that analyses an indication of signal level sufficiently far ahead of the signal being amplified.

Figure 3:
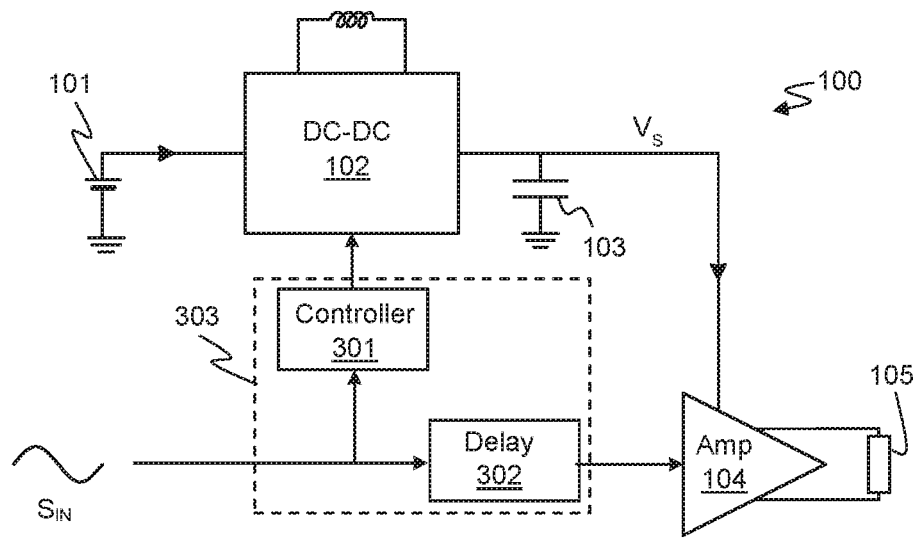
FIG. 3 illustrates an amplifier arrangement according to an embodiment.

FIG. 3 illustrates one embodiment in which similar components are identified by the same reference numerals. In the embodiment of FIG. 3 the input signal $S_{IN}$ is tapped from a main signal path upstream of the amplifier 104 and passed to controller 301. The controller 301 analyses the input signal $S_{IN}$ to determine whether that part of the signal, when amplified, will create a power demand that will likely lead to current limiting be applied within DC-DC converter 102. In some instances the controller may determine a high-amplitude part of the input signal $S_{IN}$ by determining whether the input signal level is above a predetermined threshold.

The controller 301 selectively controls the output voltage of the voltage regulator, i.e. DC-DC converter 102. The controller may selectively operate in one of at least two modes. In the event that no high-level part of the input signal $S_{IN}$ is detected the controller 301 may operate in a first mode of operation and the output voltage from the DC-DC converter 102 may be controlled to be at, or no greater than, a first voltage V1. In this first mode of operation the supply voltage may be set to provide a standard amount of voltage headroom, i.e. the nominal headroom HNOM may be of the order of the required operation headroom $H_O$. In the event however that it is detected that a part of the input signal $S_{IN}$ will likely lead to current limiting being applied within the DC-DC converter 102, then the controller 301 operates in a second mode of operation and controls the DC-DC converter 102 such that the nominal output voltage from the DC-DC converter 102 is a second voltage, V2, which is higher (and possibly significantly higher) than the first voltage V1. The controller 301 switches to the second mode of operation and increases the output voltage of the DC-DC converter 102 before the high-amplitude part of the signal reaches the amplifier 104 and in sufficient time that the output capacitor 103 can be charged to a voltage greater than the first voltage V1, for example in time that output capacitor can be charged to substantially the second voltage V2. The controller 301 thus switches to the second mode of operation before the DC-Dc converter enters an active current limiting mode of operation, and sufficiently before that the output capacitor 103 can be charged to substantially the second voltage V2. In this second mode of operation the supply voltage may be set significantly higher than is required for standard headroom, i.e. the nominal headroom HNOM is significantly higher than the required operational headroom $H_O$. Thus this second mode of operation may deliberately provide a significant excess headroom ($HE=H_{NOM}-H_O$) in order to store sufficient energy in the output capacitor. In effect the excess headroom is provided to allow a significant voltage droop of the supply voltage $V_S$ over a plurality of cycles of the DC-DC converter 102 whilst still maintain the required operating headroom $H_O$.

In order to provide this look-ahead functionality the controller 301 taps the input signal $S_{IN}$ from the signal path ahead of some delay before the amplifier 104. The delay may at least partly implemented by some deliberate delay element 302, e.g. a suitable buffer, to give a sufficient delay D between the controller identifying a high-level part of the signal and the high-level part of the signal reaching the amplifier 104. However in some instances at least part of the delay may be due to inherent propagation delays in the downstream signal path and/or other signal processing applied to the input signal $S_{IN}$ before amplification (although if such downstream signal processing varies the signal level being amplified the controller 301 should be configured to take such downstream processing into account). The controller 301 and delay element 302 can collectively be seen as being at least part of a look-ahead module 303.

Figure 4:
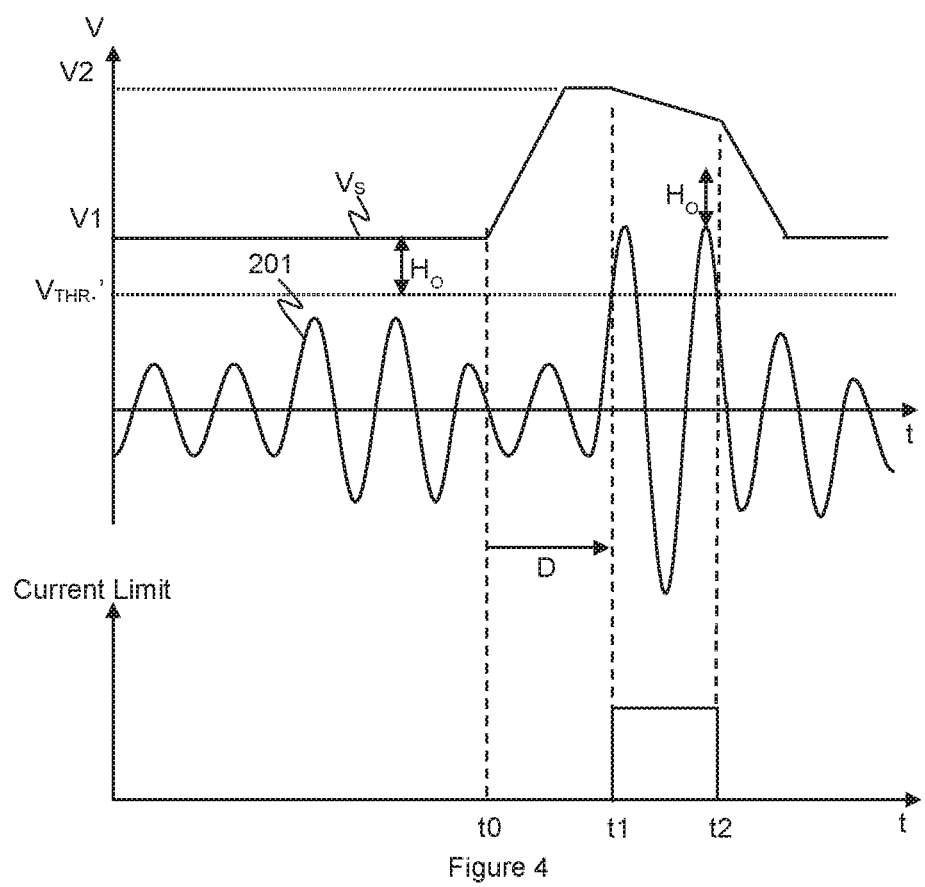
FIG. 4 illustrates example voltage waveforms for the embodiment of FIG. 3.

FIG. 4 illustrates voltage waveforms similar to those illustrated in the FIG. 2b to show one example of operation according to the embodiment of FIG. 3. FIG. 4 illustrates the same amplified signal 201 as shown in FIG. 2b. Again this signal 201 will result in the DC-DC converter 102 experiencing current limiting between times t1 and t2. In this instance however, as initially the level of the signal being amplified will not result in current limiting of the DC-DC converter 102, the output voltage from the DC-DC converter 102 is initially set at the first voltage V1 and thus the supply voltage $V_S$ to the amplifier 104 is also at V1.

The controller 301 effectively analyses the input signal $S_{IN}$ ahead of the signal being amplified by a period equal to the delay D. The controller may, in one embodiment, detect a high-amplitude part of the threshold by detecting when the input signal exceeds a threshold $V_{THR}$. For the purposes of explanation FIG. 4 illustrates a threshold $V_{THR}'$ which is scaled appropriately for the amplified signal, but it will be appreciated that this may simply be a scaled version of a threshold $V_{THR}$ which may applied to the input signal $S_{IN}$. At a time t0 the controller 301 detects a high-amplitude part of the input signal that will eventually appear at the output at time t1. The controller 301 thus switches to the second mode of operation at this time, i.e. t0, and increases the nominal output voltage of the DC-DC converter 102 to V2. The output capacitor 103 is thus charged to the voltage V2 over a period before the high level part of the input signal is amplified at time t1. When the high level part of the input signal is amplified at time t1, and the DC-DC converter 102 then experiences current limiting, the energy stored in the output capacitor 103 helps support the power supply to the amplifier 104 which thus amplifies the signal without clipping. As the power demand of the amplifier can no longer be met by the DC-DC converter 102 the charge of the output capacitor 103 is depleted over time (and over a period that may encompass several tens or hundreds of switching cycles of the DC-DC converter) and the supply voltage $V_S$ droops, but remains sufficient to provide sufficient voltage headroom for the amplifier 104, i.e. the supply voltage remains above the signal level plus the required operational headroom $H_O$. In other words the excess headroom provided by the high voltage V2 is sufficient to allow a significant voltage droop of the supply voltage $V_S$ and still provide the required operating headroom $H_O$.

At time t2 the signal 201 being amplified has again dropped to a low level and thus the controller may be changed back to the first mode of operation with a nominal output voltage of V1 from DC-DC converter 102. The output capacitor 103 will thus discharge back down to V1. The controller 301 may thus increase the output voltage of DC-DC converter 102 to the higher voltage V2 when a high-amplitude part of the input signal is detected, e.g. the input signal level is above the threshold. This high voltage operation may be maintained whilst the input signal level remains above the threshold and for a period of time afterwards corresponding to the delay D so that all of the high amplitude part of the signal is amplified before changing back to the first mode of operation at the lower output voltage.

As mentioned previously, in the first mode of operation the supply voltage V1 may be set to provide standard headroom. The maximum output signal level ($V_{SMAX}$) for the first mode of operation is effectively equal to the scaled threshold $V_{THR}'$—as an input signal above $V_{TH}$ would result in swapping to the second mode of operation. The supply voltage V1 may therefore be set to provide standard headroom for a maximum output signal level of the scaled threshold $V_{THR}'$. For example, consider that the threshold $V_{THR}$ corresponds to an output signal level of 7.5V. A nominal headroom $H_{NOM}$ of about 500 mV may be suitable for standard headroom (to provide sufficient amplifier headroom $H_A$ and to allow for voltage ripple). Thus the voltage V1 may be set to be equal to 8V. In this example the nominal headroom is thus of the order of just over 6% of the supply voltage.

In various embodiments in the first mode of operation the magnitude of the nominal headroom in the first mode may be of the order of 15% or less of the magnitude of the nominal supply voltage, or of the order of 10% or less. This may be seen as a standard headroom.

In some embodiments the magnitude of the nominal headroom may be of the order of 1V or less.

In the second mode of operation the supply voltage is set so as to store sufficient energy in the output capacitor, or some other energy storage element coupled to the supply rail. In this case the nominal supply voltage is set to provide significant excess headroom so that significant droop of the supply voltage below the nominal voltage can be experienced, over many switching cycles, and the actually supply voltage remains high enough to provide the operating headroom $H_O$. The controller 301 swaps to the second mode of operation when the input signal $S_{IN}$ exceeds the threshold $V_{THR}$ which, in the example above, corresponded to an output signal level of 7.5V. In the second mode of operation the maximum expected output signal level may be limited by design as discussed above, and may, for example, be of the order of 8.5V. In the second mode of operation the supply voltage may be raised to a nominal supply voltage of 12V say, i.e. V2=12V in this example. The nominal headroom in the second mode of operation is thus 3.5V, which is significantly higher than the 0.5V that may be required for standard headroom reasons. The nominal headroom in this case is of the order of 30% of the magnitude of the nominal supply voltage.

In some embodiments therefore the magnitude of the nominal headroom in the second mode of operation may be of the order of at least 20% of the magnitude of the nominal supply voltage, or at least 25% of the magnitude of the nominal supply voltage.

In some embodiments the excess headroom (i.e. $H_{NOM}$–$H_O$) in the second mode may be of the order of at least 10% of the magnitude of the nominal output voltage. In the first mode any excess headroom may be lower than 10% of the magnitude of the nominal output voltage and may be lower than 5% of the magnitude of the nominal output voltage. In other words the excess headroom in the second mode of operation may be sufficient to allow a voltage droop of at least 5% of the supply voltage from the nominal value, or a voltage droop of at least 10%, or in some embodiments at least 15% or at least 20%. Such a large voltage droop could not be tolerated if standard voltage headroom were to be provided.

In some embodiments the nominal headroom in the second mode may be of the order of at least 1V or at least 2V.

It will of course be appreciated that any specific figures for supply voltage and headroom are given by way of example only and are not limiting. The exact figures will depend on a particular implementation.

In this way peaks of the signal are supported by the output capacitor 103 being pre-charged to a high level but only when required, thus enabling the amplifier to be operated with a lower voltage supply voltage at other times when the high voltage is not required, thus greatly increasing power efficiency.

It will be appreciated by one skilled in the art that there is some similarity to Class-G or Class-H amplifier techniques. In a Class-G or Class-H amplifier the supply voltage $V_S$ supplied to the amplifier is varied based on an indication of the signal to be amplified. If the signal $S_{IN}$ to be amplified has a relatively low level the supply voltage $V_S$ may be reduced to reduce the excess voltage headroom and consequently reduce power wastage. If the input signal level $S_{IN}$ then increases the supply voltage may be increased to provide appropriate voltage headroom. There may be relatively continuous tracking of the supply voltage $V_S$ with the signal level or the supply voltage may be varied between one or more set levels when the signal level falls in various bands, e.g. by comparison with one or more thresholds.

Conventional class-G and class-H operation however is purely concerned with voltage headroom and adjusts the voltage purely to ensure there is sufficient voltage headroom for the present signal voltage or signal range. At each operating voltage it is expected that the DC-DC converter 102 can meet the power demand of the amplifier and any output capacitor 103 is only charged to a level to support the load demand between the charging phases of the DC-DC converter 102. Thus for class-G or class-H operation the supply voltage will be defined based on the required standard operating headroom, i.e. amplifier headroom $H_A$ and voltage ripple $\Delta V_R$, for that particular signal level or band of signal levels. In each case the nominal headroom between a particular supply voltage and the corresponding output signal level or maximum output signal for a band of signal levels that all use the same supply voltage, would be relatively low, say of the order of 10% or less of the magnitude of the relevant supply voltage.

By contrast the present embodiments switch to the high voltage mode of operation based on a determination of when the DC-DC converter 102 will enter a current limited mode of operation and operates with a sufficiently high voltage for a period before the higher signal level is incident on the amplifier such that the output capacitor stores additional energy and can help support the load demand during all switching phases of the DC-DC converter. The second mode of operation provide excess headroom, significantly greater than what is required for conventional headroom. As discussed above in the second mode of operation of some embodiments of the nominal headroom may be at least 20%, or at least 25% of the magnitude of the particular supply voltage.

In embodiments of the present disclosure the controller 301 may determine when the DC-DC converter 102 may enter a current limited mode of operation by determining when the signal level of the input signal exceeds a threshold $V_{THR}$.

The threshold $V_{THR}$ may be determined based on parameters of the DC-DC converter 102 and the amplifier 104 and possibly other relevant system parameters.

Figure 5:
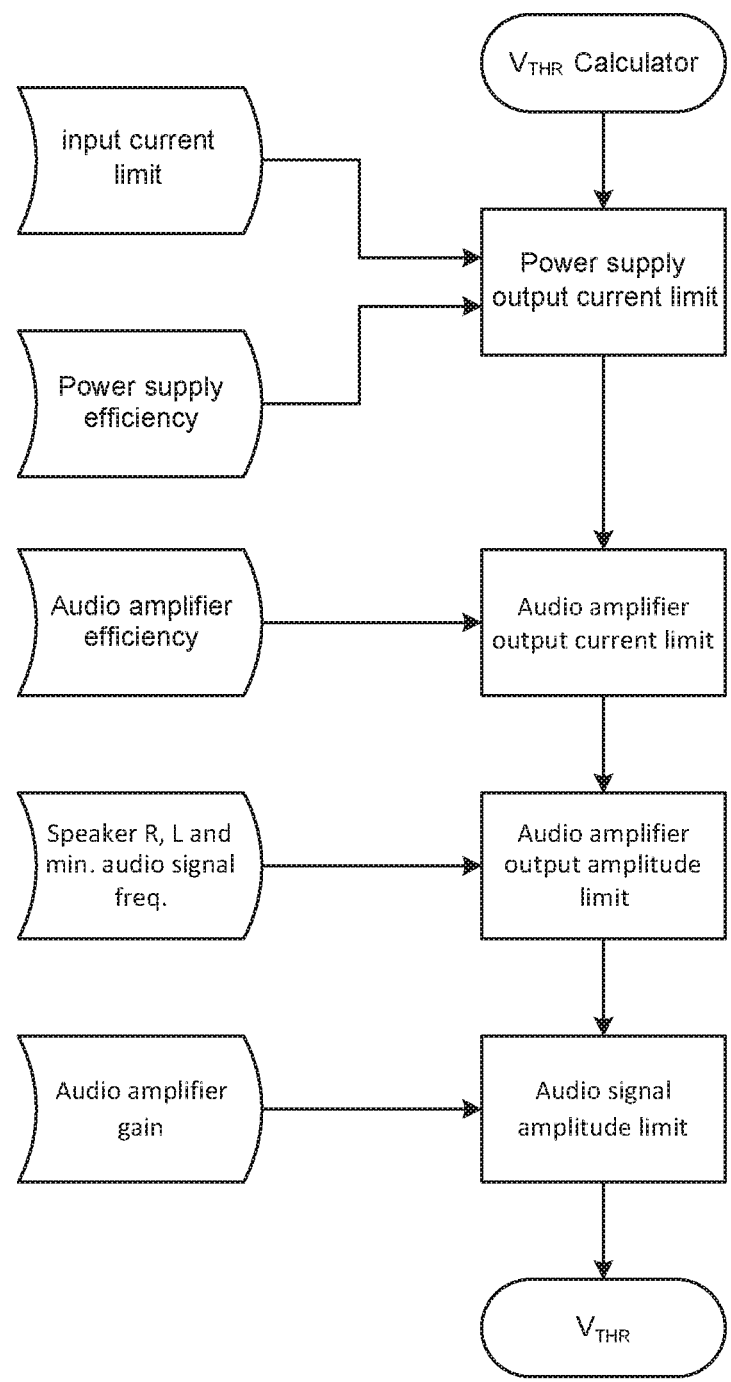
FIG. 5 illustrates one example of determining a voltage threshold.

In one example the threshold $V_{THR}$ may be determined or calculated as illustrated with respect to FIG. 5. The maximum output current that may be supplied by the DC-DC converter 102, i.e. a power supply output current limit, may be determined based on the input current limit applied to the DC-DC converter 102 and an efficiency value of the power supply, i.e. the DC-DC converter 102. The current limit to be applied will be defined in use and can be a known value. The efficiency value for the DC-DC converter 102 may be a worst-case expected efficiency value. This value will typically be known from design or simulation of the DC-DC converter but in some instances historic measured efficiency values may be used.

Based on this maximum output current that can be supplied from the DC-DC converter, before entering current limiting, and an efficiency value of the amplifier, an output current limit from the amplifier 104 may be determined. This would represent the maximum expected current that could be delivered from the amplifier 104 before the DC-DC converter 102 would enter current limiting. The efficiency value for the amplifier may likewise be a known value based on design of the amplifier and/or measured values.

Based on the parameters of the load 105 being driven by the amplifier 104 this maximum output current limit from amplifier 104 can be converted to an indication of the maximum output amplitude, i.e. drive voltage, that the amplifier 104 could drive without exceeding the current limit. The load parameter may in particular be the load impedance R. In some instances the load inductance L may additionally or alternatively be used to determine the output amplitude limit. These impedance and/or inductance values may be known for the relevant load, especially for an on-board loudspeaker, at the time of device manufacture. However in some instances these values could be assumed based on the expected type of load or at least some measurement could be made in use.

The current drawn by the load 105 for a certain amplitude driving signal may also depend on the audio frequency and thus to determine an amplitude limit an indication of the minimum audio signal frequency may additional be taken into consideration.

Finally this output amplitude limit may be converted to an input signal amplitude limit based on the gain of the amplifier 104 (and possibly any gain adjustment in the signal path between the point at which the controller 301 taps the input signal and the amplifier 104).

In this way an input signal amplitude threshold $V_{THR}$ may be defined, above which it is expected that the power demand would result in the DC-DC converter entering a current limited mode of operation.

Note that FIG. 5 illustrates the various steps in calculating a threshold $V_{THR}$ in order to explain the principles that may be used in determining an appropriate threshold. In practice it would not be necessary to perform these as individual steps in sequence and for instance a single calculation could be performed with all relevant inputs and/or various of the inputs described above could be combined in a suitable way.

In some instances each of the inputs described may be known for a particular implementation and may not vary in use. In such cases it would be possible to determine a suitable threshold value to be stored or programmed to be available to controller 201. $V_{THR}$ could for instance be stored in memory or loaded into memory at start-up by system software.

In at least some embodiments however at least some of the inputs may vary in use. For instance the input current limit to be applied to the DC-DC converter may be programmable and varied, in use, depending on the battery state.

When the battery is relatively deeply discharged, current drawn from the battery can cause a drop in battery voltage to a voltage so low that it results in a system reset. The input current limit for the DC-DC converter 102 may be set so as to avoid drawing too large a current for this reason. However when the battery is fully charged the voltage drop is less of a problem as the voltage will not drop below the reset threshold.

In some embodiments therefore the battery voltage may be monitored and the input current limit controlled based on the battery voltage, with the current limit being decreased as the battery discharges. This has the advantage of allowing the DC-DC converter 102 to draw more current at high battery charge state and therefore the threshold $V_{THR}$ level can be higher. A higher threshold $V_{THR}$ means the amplifier circuit operates in the lower voltage mode for a greater audio signal dynamic range, increasing efficiency.

Figure 6:
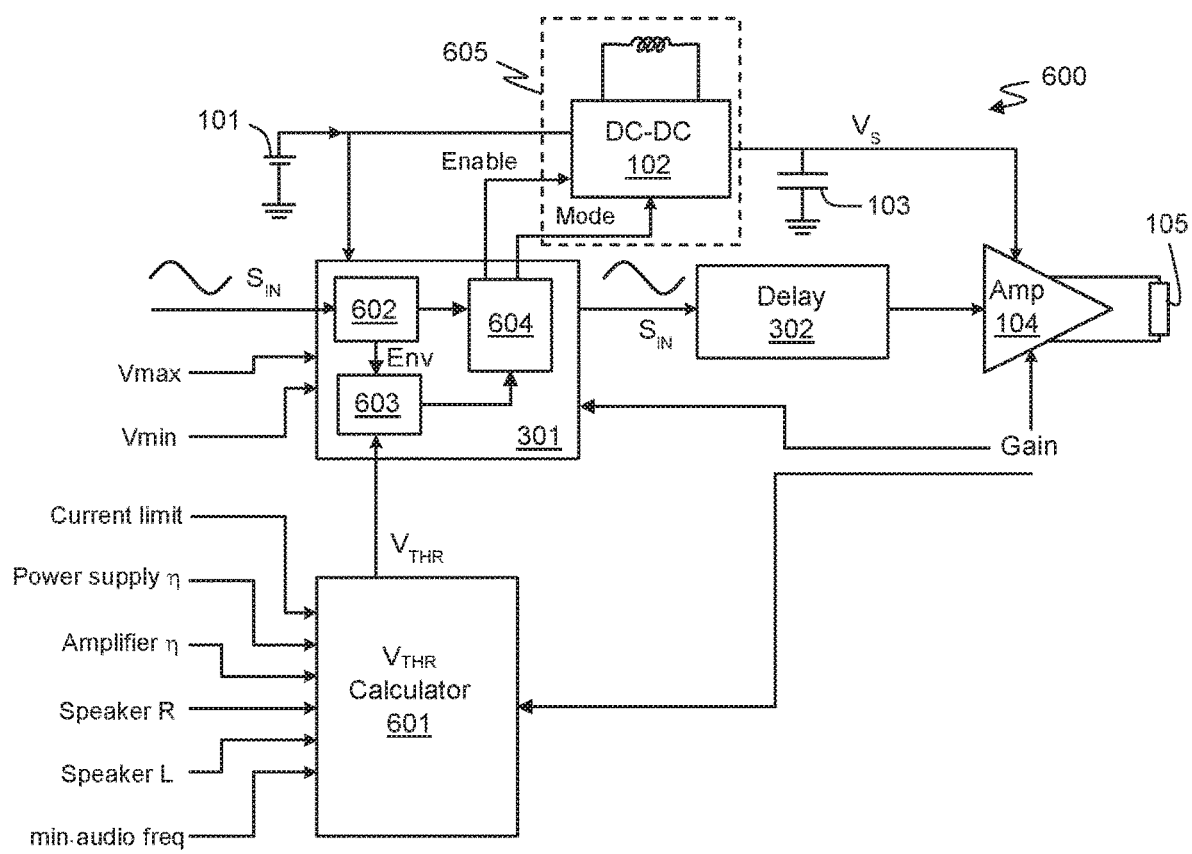
FIG. 6 illustrates an amplifier arrangement according to another embodiment.

Thus in some embodiments the amplifier circuit may include a threshold generator, e.g.

a threshold calculation module as illustrated in FIG. 6. FIG. 6 shows an amplifier circuit 600 in which similar components are identified by the same references numerals as used previously.

In FIG. 6 a threshold calculator 601 is provided to determine a threshold $V_{THR}$ to be applied by controller 301 to determine whether to operate with the high defined voltage V2 or a lower operating voltage, e.g. V1 or lower. The threshold calculator may comprise a dedicated circuitry for determining the threshold value $V_{THR}$ and/or may comprise a software module, for instance running on a suitable processor.

The threshold calculator 601 may run at system power-on or reset to produce $V_{THR}$ and/or may operate continuously if the parameters used to calculate the threshold vary in use.

The threshold calculator may receive at least some of the input described previously. The input current limit for the DC-DC may be programmable and may be stored in memory and can be read by the $V_{THR}$ Calculator. In some instances the input current limit may be adaptive as described above.

Values for power supply (i.e. DC-DC converter) efficiency η and audio amplifier efficiency η may be stored in memory. The speaker resistance, inductance and minimum audio signal frequency may also be stored in memory and may be programmable. In some instances a measure of loudspeaker impedance and inductance and how it varies over time may be determined in use for some other reason, e.g. for speaker protection and in some instances the impedance and/or inductance value may be updated in operation.

Likewise if the gain of the amplifier 104 is variable in use the gain of the amplifier may also be used to vary the threshold $V_{THR}$.

The threshold value $V_{THR}$ is provided to the controller 201. The controller 201 also receives an indication of the input signal $S_{IN}$ in order to determine whether the level of input signal is above a threshold. In some embodiments the controller 201 receives the input signal $S_{IN}$ itself and determines whether the signal level is above the threshold $V_{THR}$.

The controller 301 may thus comprise a level detector 602, such as an envelope detector, to determine an envelope level Env for the input signal $S_{IN}$. The envelope detector 602 may, for example, peak detect the input signal, with a relatively fast attack time to increases in signal level but with a decay time set with respect to the expected signal frequencies to maintain an envelope value.

A comparator 603 may be provided for comparing the determined signal level with the threshold $V_{THR}$. A mode controller 604 may be responsive to the comparator 603 to generate a Mode control signal to control an appropriate mode of operation of the DC-DC converter. In some instances the Mode control signal be a suitable voltage reference signal for indicating the desired output voltage to be generated by the DC-DC converter 102.

To provide sufficient time to charge the output capacitor 103 to the defined higher voltage, e.g. V2, before a high level part of the signal reaches the amplifier 104, without requiring the delay 302 to be unduly long, the controller should preferably respond quickly to any increases in input signal level. As discussed the envelope detector 602 may therefore have a fast attack time. In some embodiments the input signal received by the envelope detector 602 may be processed in some way, for instance being filtered by a pre-emphasis filter to emphasise any rise in signal level, as will be understood by one skilled in the art, so as to provide a fast response to increases in signal level.

To avoid unnecessary changes in mode between the defined high voltage mode applied when the DC-DC converter may be current limited and the lower voltage mode where current limiting is not expected, the envelope detector may have a slower decay time and/or at least one of the comparator or mode controller may apply some degree of hysteresis to changing between modes. For example the voltage threshold $V_{THR}$ may be the threshold applied to switch into the defined high voltage mode of operation, but the high voltage mode of operation may be maintained until the signal level drops below a lower threshold.

In some embodiments the controller 301 may not contain an explicit peak detector and in some embodiments may not derive an actual envelope signal Env, and the Mode control signal may be generated by other means, for instance a comparator coupled without peak detection to the input signal $S_{IN}$, the comparator having hysteresis and/or a timeout, to effectively provide a type of envelope detection and generate the Mode control signal.

Further in some embodiments the controller 301 may receive some other indication regarding the amplitude or envelope of the input signal. For instance in some embodiments the signal level of the input signal may be determined by some upstream processing and provided to the controller or some other signal indicative of the likely signal amplitude may be provided.

Embodiments therefore use an indication of signal level to determine when the DC-DC converter 102 may enter experience current limiting and in particular determine when the input signal level exceeds a threshold $V_{THR}$ which is determined to correspond to likely current limited mode of operation. If the signal level is above the threshold the controller 301 controls the DC-DC converter 102 in the second mode of operation, which is a defined high voltage mode, to produce an output voltage that is higher than required for the peak voltage level of the amplifier. The controller 301 operates in this second mode in order to pre-charge the output capacitor 103 to support a current demand during amplification of the high level part of the signal. If however the signal level remains below the threshold the controller 301 may operate the DC-DC converter in a first mode with a lower output voltage.

In some embodiments further efficiency gains may be realised by operating the DC-DC converter using Class-G or Class-H type techniques in the first mode of operation, with the second mode of operation being a different mode of operation.

As mentioned previous Class-G or Class-H type operation is a known type of operation for amplifiers where the supply voltage $V_S$ to the amplifier is adjusted based on an indication of signal level so as to provide appropriate voltage headroom for the signal being amplified, or the maximum signal level within a range, but to reduce the excess voltage headroom.

When operating in the first mode of operation, i.e. when the DC-DC converter is not operating in a current limited mode of operation, the output voltage of the converter may thus be controlled based on an indication of the signal level to control the supply voltage to track the signal level, either substantially continuously between a minimum voltage and the voltage threshold $V_{THR}$ in a Class-H implementation, or to one of a plurality of defined voltage levels for defined bands of signal level for a Class-G type implementation.

The envelope detector 602 of controller 301 may thus provide an envelope value that can be used by mode controller 604 to implement Class-H tracking or which may be used by comparator 603 to compare against a plurality of different voltage thresholds to determine an appropriate supply voltage to be supplied by the DC-DC converter 102.

The first mode of operation may therefore be seen as having various sub-modes of operation or as a mode with a variable voltage based on voltage headroom.

In some embodiments the DC-DC converter 102 may have a minimum output voltage that can be achieved. Thus in some embodiments the mode controller 604 may control the DC-DC converter 102 in the first sub-mode of operation for input signal levels which are lower than the current limiting threshold $V_{THR}$ and may vary the output voltage of the DC-DC converter between the minimum voltage $V_{MIN}$ and a maximum voltage V1 for the first mode of operation.

The voltage V1 will correspond to a voltage which provides sufficient headroom for amplifying signals which are just below the threshold $V_{THR}$ for current limiting. Thus, as described previously, V1 may be set to provide a nominal headroom that is sufficient for the required operating headroom $H_O$, i.e. the amplifier headroom $H_A$ and voltage ripple $\Delta V_R$.

For a boost converter, i.e. a DC-DC converter with a step-up topology, the minimum output voltage may correspond to a step-up factor of 1, i.e. the minimum output voltage may be equal to the input voltage. In such a case rather than operate the DC-DC converter 102 to effectively provide the battery voltage as an output, with associated power consumption due to operation of the DC-DC converter 102, in some embodiments the controller 301 may also be operable to control the DC-DC converter 102 to operate in a bypass mode. In the bypass mode the switching components of the DC-DC converter 102 may be disabled, or at least the switching frequency significantly reduced to reduce power consumption, with the battery voltage being supplied directly to the output. The DC-DC converter 102 may therefore comprise part of a voltage regulator 605, wherein in the bypass mode the voltage regulator may disable the DC-DC converter 102 and deliver the battery voltage as the output voltage of the voltage regulator.

Thus if the input signal level is such that the battery voltage itself would provide sufficient conventional voltage headroom for the signal to be amplified, taking into account the gain applied by the amplifier 104 and any downstream processing between the controller 301 and the amplifier 104, the mode controller 604 may control the DC-DC converter 102 in a bypass mode of operation. If the signal level increases so that the battery voltage is no longer sufficient, but the signal level remains below the current limiting threshold $V_{THR}$ the DC-DC converter 102 may be controlled with an appropriate voltage reference to provide sufficient conventional voltage headroom for the signal being amplified. If the signal level exceeds the current limiting threshold $V_{THR}$ the DC-DC converter 102 is switched to the second mode of operation and the output voltage of the DC-DC converter 102 is increased to the high voltage V2 and thus provide excess voltage headroom.

In some embodiments however the DC-DC converter may be a buck-boost converter capable of both step-up and step-down operation. In which case the DC-DC converter 102 may always be operated with the output voltage being controlled in the first mode between the minimum output voltage, which may be lower than the battery voltage $V_{BATT}$, and the maximum output voltage V1 for the first mode of operation.

The maximum voltage output by the DC-DC converter 102 in use will be the high-defined voltage V2 used in the second mode of operation. This voltage may be programmable to account for different manufacturers using output capacitors of different sizes. The controller 301 may thus be response to an indication $V_{MAX}$ of the high voltage to be used in the second mode. The controller 301 may also be provided with an indication $V_{MIN}$ of the minimum voltage that can be achieved by the DC-DC converter 102 and also an indication of the Gain applied by the amplifier 104.

As mentioned above the delay 302 may be set so as to allow time for the output capacitor to charge to the defined high voltage, i.e. $V_{MAX}$, before the high level part of the signal reaches the amplifier 102. The amount of the delay may be determined by the largest change in supply voltage. For the step-up topology this may be the time to enable the DC-DC converter 102 to charge the output capacitor from an initial voltage of $V_{BATT}$ up to the defined high voltage $V_{MAX}$. For a buck-boost converter the required voltage change could be from $V_{MIN}$ to $V_{MAX}$. The voltage slew rate of the supply voltage is known from the DC-DC converter design and depends on at least some of the topology, switching frequency, inductor ripple current, output capacitor and load.

In some embodiments the delay may be programmable to allow different choice of DC-DC converter components, e.g. inductor and output capacitor, and also switching frequency.

The delay 302 may also include additional delay for digital to analogue conversion and/or pulse width modulation as part of the audio amplifier implementation. This portion of the delay is dependent on amplifier topology, is known from design and has a fixed duration.

Figure 7:
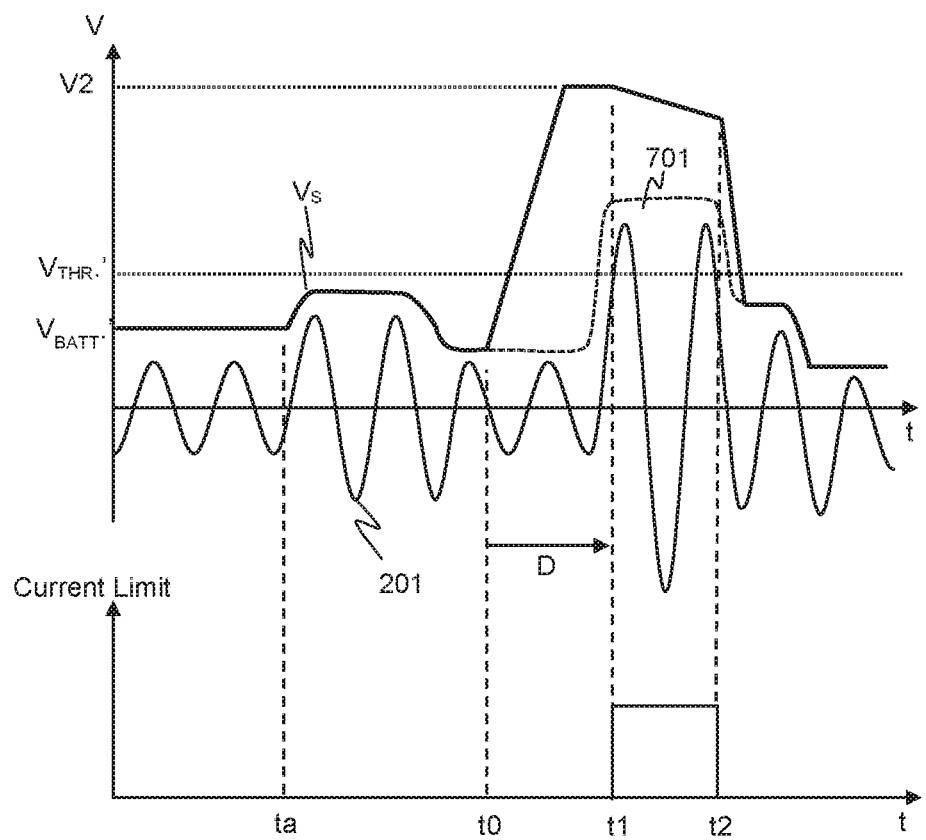
FIG. 7 illustrates example voltage waveforms for the embodiment of FIG. 6.

FIG. 7 illustrates voltage waveforms similar to those illustrated in FIGS. 2 and 4 to show one example of operation according to the embodiment of FIG. 6. FIG. 7 illustrates the same amplified signal 201 as shown in FIGS. 2 and 4.

In this example initially the signal level is at a level where the battery voltage $V_{BATT}$ would provide sufficient voltage headroom for the amplifier 104. Thus, as described above the controller 301, may, in some instances, operate the DC-DC converter 102 in a bypass mode of operation and the battery voltage may be provided directly as the output voltage of the voltage regulator. This may, for instance, be the case where the DC-DC converter 102 is a boost converter.

At a time to the level of the signal being amplified has increased such that the battery voltage $V_{BATT}$ is no longer sufficient. The controller 201 thus enables the DC-DC converter 102 and increases its output voltage to a level sufficient for this increased signal level. It will be understood that the controller 301 will be aware of this signal level increase at a time before the increase reaches the amplifier by an amount equal to the delay time D. The amount of this delay is set with regard to the maximum time taken to slew to the maximum output voltage V2 in the second mode of operation and thus may be a greater delay than is required for Class-H tracking. The controller can thus determine the appropriate time to implement the relevant increase or decrease in output voltage. Between time ta and t0 the output voltage of the DC-DC converter may be controlled to track the amplitude of the signal being amplified with appropriate headroom. Purely for the purposes of illustration FIG. 7 shows that with a buck-boost converter the supply voltage may also be controlled to be lower than the battery voltage when appropriate.

At time t0, in a similar manner as described above, it is detected that the input signal level exceeds the current limiting threshold $V_{THR}$. Thus the output voltage of the DC-DC converter 102 is increased to the defined high voltage V2 to charge the output capacitor 103 to this voltage. This additional energy stored in the output capacitor 102 supports the load current demand during this period of high signal level until time t2, where the signal 201 being amplified has again dropped to a low level and thus the DC-DC converter 102 may be switched back to the first mode of operation and may resume Class-H operation.

By way of contrast for the purposes of explanation FIG. 7 also illustrates, by dashed line 701, the operation of the voltage supply that would be implemented if current limiting were not to occur. In such a case it would be expected that the supply voltage $V_S$ would track the signal level in the same way as illustrated up until time t0. In this case the high level part of the signal, which is output between time t1 and t2, would still be detected in advance of it being amplified but the amount of look ahead required may be less. The supply voltage is thus increased before the high level part of the signal is amplified at t1 but the supply voltage only tracks the signal level with conventional headroom. The supply voltage during the high level part of the signal between t1 and t2 is thus much lower than the voltage V2 used to provide excess headroom when current limiting is an issue. As such less time is required to charge the output capacitor 103 to the required output voltage and the supply voltage can be maintained on a cycle-by-cycle basis of the DC-DC converter 102. FIG. 7 illustrates that the high voltage V2 used in the second mode of operation thus has significant excess headroom compared to the standard headroom for class G/H tracking.

Embodiments of the present disclosure thus provide amplifier arrangement that can meet audio power requirements whilst offering good efficiency and without requiring unduly large capacitances. Embodiments allow the techniques of Class-G and/or class-H type amplifiers to be used with a DC-DC converter that may experience current limiting in use due to a defined battery current limit. A defined high voltage mode may be entered when it is determined that the input signal level exceeds a threshold at which current limiting is expected. In some embodiments a threshold calculator may calculate an appropriate threshold based on one or more variable parameters, such as an input current limit for the DC-DC converter.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile telephone, an audio player, a video player, a PDA, a mobile computing platform such as a laptop computer or tablet and/or a games device for example. The host device may comprise one or more audio output transducers, e.g. loudspeakers to be driven by an amplifier arrangement as described.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An amplifier circuit for amplifying a signal, comprising:
a voltage regulator having an input node for receiving an input voltage and an output node for outputting an output voltage, the voltage regulator comprising an output capacitor coupled to the output node;
an amplifier coupled to receive the output voltage from said output node of the voltage regulator as a supply voltage;
the voltage regulator being operable in a voltage-control mode to maintain the output voltage at a nominal output voltage; and
a controller for defining the nominal output voltage;
wherein the controller is operable to increase the output voltage in response to a reference signal indicating a power demand greater than a steady state power demand of the voltage regulator; and
wherein the increase of the output voltage is in excess of that required by the amplifier circuit.

2. The amplifier circuit of claim 1 wherein the controller is operable to compare an indication of a level of the reference signal to a threshold value and to increase the output voltage if the indication of the level of the reference signal exceeds the threshold value.

3. The amplifier circuit of claim 2 comprising a threshold generator for determining said threshold value.

4. The amplifier circuit of claim 3 wherein the threshold generator comprises dedicated circuitry for determining the threshold value.

5. The amplifier circuit of claim 3 wherein the threshold generator comprises a programmable processor supplied with a software module for determining the threshold value.

6. The amplifier circuit of claim 3 wherein the threshold generator is configured to determine the threshold value based on at least one parameter which varies in use, said at least one parameter comprising one of: an input current limit value; a battery voltage; voltage regulator efficiency; amplifier efficiency; load impedance; load inductance; and amplifier gain.

7. The amplifier circuit of claim 1 wherein, in the voltage-control mode, the controller is configured to vary the nominal output voltage based on a level of the reference signal.

8. The amplifier circuit of claim 1 wherein the voltage regulator comprises a DC-DC converter.

9. The amplifier circuit of claim 8 wherein the controller is configured to vary a voltage reference signal supplied to the DC-DC converter to define the nominal output voltage.

10. The amplifier circuit of claim 2 wherein the controller is configured to receive the indication of the level of the reference signal.

11. The amplifier circuit of claim 2 wherein the controller is configured to receive a version of the reference signal and to determine the indication of the level of the reference signal.

12. The amplifier circuit of claim 11 wherein the amplifier circuit comprises an envelope detector for receiving the version of the reference signal and determining an envelope value as the indication of the level of the reference signal.

13. The amplifier circuit of claim 1 comprising a delay in a signal path for the reference signal upstream of the amplifier.

14. The amplifier circuit of claim 13 wherein the delay comprises a buffer of configurable size.

15. The amplifier circuit of claim 1 wherein the reference signal is an input signal to be amplified by the amplifier.

16. The amplifier circuit of claim 10 wherein the reference signal is an audio input signal to be amplified by the amplifier.

17. The amplifier circuit of claim 1 comprising a battery, wherein the input node of the voltage regulator is coupled to receive the input voltage from said battery.

18. An electronic device comprising an amplifier circuit as claimed in claim 1.

19. The electronic device of claim 18, wherein the electronic device is at least one of: a portable device; a battery operated device; a communication device; a mobile or cellular telephone device; a smartphone; a computing device; a laptop, notebook or tablet computing device; a gaming device; a personal media player; a wearable device.

20. An amplifier circuit for amplifying a signal, comprising:
a voltage regulator having an input node for receiving an input voltage and an output node for outputting an output voltage, the voltage regulator comprising an output capacitor coupled to the output node;
an amplifier connected to receive the output voltage from said output node of the voltage regulator as a supply voltage;
the voltage regulator being operable in a voltage-control mode to maintain the output voltage at a nominal output voltage and in current-control mode to apply current limiting so as to limit an input current drawn by the voltage regulator via the input node so as not to exceed a defined input current limit; and
a controller for defining the nominal output voltage;
wherein the controller is operable in a first mode to define the nominal output voltage to be equal to a first voltage magnitude and is operable in a second mode to define the nominal output voltage to be equal to a second voltage magnitude, the second voltage magnitude being greater than the first voltage magnitude;
wherein the controller is configured to monitor an indication of the level of the signal for a high-amplitude part of the signal that could result in the voltage regulator operating in the current-control mode to apply current limiting; and
wherein the controller is configured to operate in said first mode until such a high-amplitude part of the signal is indicated and, on such indication to operate in the second mode of operation until such indication is no longer asserted;
wherein the second voltage magnitude is greater than required for voltage headroom for amplifying the high-amplitude part of the signal so as to allow for a voltage droop of the output voltage over a plurality of switching cycles.

21. The amplifier circuit of claim 20, wherein the voltage droop occurs when operating in the current-control mode.

* * * * *